United States Patent [19]
Thompson et al.
[11] 4,326,599
[45] Apr. 27, 1982

[54] SPEAKER BEZEL/RETAINER

[75] Inventors: Phillip B. Thompson, Westminster; Hill W. Roberts, Anaheim, both of Calif.

[73] Assignee: McDonnell Douglas Corporation, Long Beach, Calif.

[21] Appl. No.: 268,897

[22] Filed: Jun. 1, 1981

[51] Int. Cl.³ .......... H05K 5/00
[52] U.S. Cl. .......... 181/175
[58] Field of Search .......... 181/175, 148, 158, 199, 181/141, 149, 150; 248/56, 27.1; 312/7 R

[56] References Cited

U.S. PATENT DOCUMENTS

| | | | |
|---|---|---|---|
| 3,140,754 | 7/1964 | Motsinger | 181/158 |
| 3,952,834 | 4/1976 | Somner et al. | 181/148 |

*Primary Examiner*—George H. Miller, Jr.
*Assistant Examiner*—Benjamin R. Fuller
*Attorney, Agent, or Firm*—Paul T. Loef; George W. Finch; Donald L. Royer

[57] ABSTRACT

A speaker grille bezel-retainer terminating in a tubular portion with multiple groups of radially intermittent serrations axially displaced to receive a matching bezel ring having an inside diameter with alternate tabs and cut-outs and the tab is shaped to form a ramp to axially advance the ring on the bezel while rotationally engaging spaced, aligned pairs of serrations.

6 Claims, 3 Drawing Figures

SPEAKER BEZEL/RETAINER

BACKGROUND OF THE INVENTION

This invention relates to bezel mounted enclosures for panel openings and more particularly to bezel mounted speaker grilles.

The interior of a commercial aircraft, other than the floor, is constructed of a series of panels of various shapes and thicknesses which generally follow the interior structure of the aircraft. The interior panels vary in thickness and in shape depending on their function and the applied stress, are usually covered with a decorative material and form the interior of the passenger compartment. Penetrations are required in these panels to accommodate various services, including speakers from the audio system. Generally, a hole is provided in the panel, and the speaker is mounted on the back side of the panel. The hole needs to be covered for asthetic reasons as the hole edge is unfinished and the hole exposes the speaker cone. Typically, a speaker grille is installed covering the hole and permitting transmission of the sound waves. Prior art speaker grilles require mechanical attachments of some sort e.g. screws, inserts, etc. and since the panel is generally of honeycomb construction, they require edge blocking or finishing of the hole edge, both operations are costly and time consuming and are not conducive to field rework. A single large aircraft, like the DC-10, requires 120 speaker outlets at various locations in different panels of various thickness.

It is a principal object of this invention to provide an improved bezel mounted speaker grille which is both simpler and cheaper to manufacture and install in panels of various thicknesses, which can be replaced expeditiously.

A further object of this invention is to provide a grille assembly requiring only a simple hole through the honeycomb panel for installation and can be readily installed in the field.

SUMMARY OF THE INVENTION

In summary, the speaker grille bezel-retainer of this invention accomplishes the above objects and overcomes the disadvantages of the prior devices by providing a bezel terminating in a tubular portion having multiple groups of radially aligned but intermittent, circumferentially oriented and axially displaced parallel serrations located on the outside surface of the tubular portion. A bezel ring is provided having an inside diameter which is alternately stepped to a larger diameter to match the multiple groups of radially intermittent serrations on the outside diameter of the tubular portion of the bezel so as to form alternately circumferential tabs followed by cut-outs to match the serrations and spaces on the bezel. The tab portion is shaped to form a ramp which advances the bezeled ring axially as the ring rotationally engages between aligned pairs of the serrations. The opening in the bezel may be closed with any suitable material including cloth, metal or plastic.

BRIEF DESCRIPTION OF THE DRAWING

With reference to the drawings, wherein like reference numerals designate like portions of the invention.

DESCRIPTION OF THE PREFERRED EMBODIMENT

Figure 3:
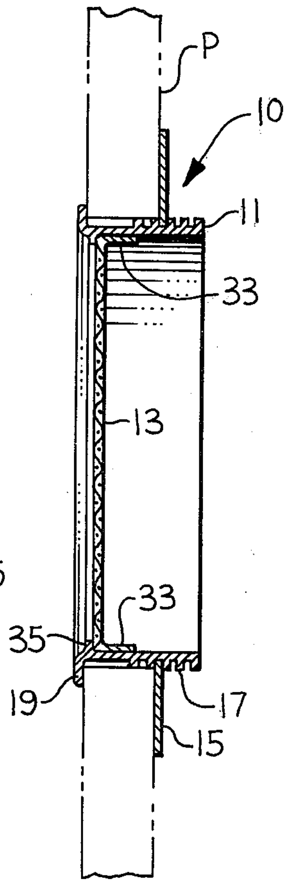
FIG. 3 is a section view of the bezel speaker grille and ring installed in a typical panel.

FIG. 3 shows the speaker bezel grille 10 assembled on a panel P, shown in reference. The bezel 11 is shown with a separate grille 13 and retained by the bezel ring 15.

Figure 1:
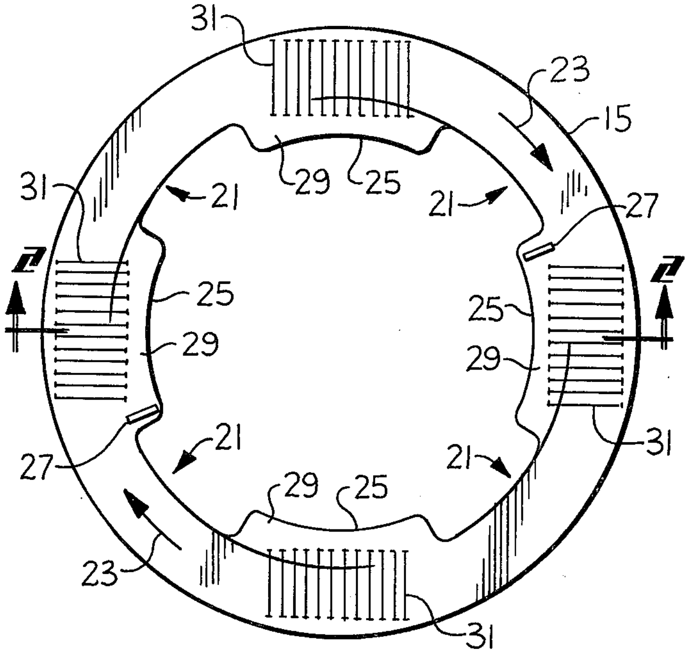
FIG. 1 is a plan view showing one side of the bezel ring.
Figure 2:
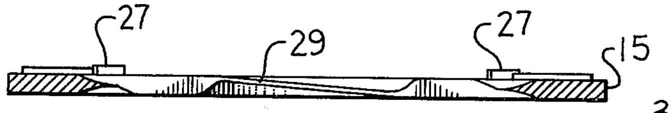
FIG. 2 is a sectional view of FIG. 1 showing a typical ramped surface for tightening the bezel ring on the bezel.

The bezel 11 has a bezel proper portion shown at 19 followed by a cylindrical or tubular portion which terminates externally in intermittent circumferential serrations, shown at 17. The intermittent circumferential serrations 17 match the cutouts 21, shown in FIG. 1 so as to allow the bezel ring 15 to slide over and circumferentially encompass the bezel 11. When the ring 15 contacts the panel p, bezel ring 15 is rotated in the direction of the arrows shown at 23. The ramped tab portion 25 of the bezel ring 15 engages the serrations 17 of the bezel 11 and advances until it engages the stops at 27. Ramp 29 is provided on the tab 25 and while the serrations 17 have no lead angle the helex or slope on the ramp 29 axially advances the bezel ring 15 to tightly engage the panel P. Flat serrations 31 are shown at four places and are provided simply to make a roughened surface so that the installer's hand does not slip on the smooth bezel ring 15 when rotated for engagement with the serration 17 and the bezel 11. Intermittent blocks 33 are shown spaced from the bezel lip 35 so that the grille 13 may be slightly distorted on installation so as to pass the blocks 33, the spring back to its original shape and be retained in place between the lip 35 and the blocks 33. Alternatively, the grille 13 may be molded as one piece with the bezel 11. However, a separate grille 13 allows for modified alternate artistic designs in the grill work.

Typically the bezel 11 and the bezel ring 15 are molded plastic and the grille 15 is made from perforated metal sheet.

While the preferred embodiments of this invention have been described above and shown in the accompanying drawings, it is to be understood that such embodiments are merely illustrative of, and not restrictive on the broad invention and it is not intended that the invention be limited to the specific arrangements, construction or structures described or shown, for various modifications thereof may occur to persons having ordinary skill in the art.

What is claimed is:

1. A speaker grille bezel-retainer comprising:

a bezel terminating in a tubular portion having at least three groups of planar but radially intermittent, circumferentially oriented and axially displaced serrations arranged on the outside of said tubular portion with said radial intermissions at least equal to the length of said serrations;

a bezel ring having an inside diameter sized to slideably engage the outside diameter of said tubular portion of said bezel and having intermittent cutouts stepped to a larger diameter so as to leave alternate tabs and cut-outs, said cut-outs oriented and sized to clear said at least three groups of planar but radially intermittent, circumferentially oriented and axially displaced serrations on said tubular portion of said bezel and said tabs shaped and sized to form a ramp which axially advances said bezel ring when said bezel ring is rotated relative to said bezel with said ramp engaging between aligned parts of said serrations; and means for closing said inside diameter of said bezel.

2. The speaker grille bezel-retainer of claim 1 further comprising at least one stop on said bezel ring to prevent further rotation of said bezel ring relative to said bezel after full circumferential engagement.

3. The speaker grille bezel-retainer of claim 1 wherein said bezel and said means for closing said inside diameter of said bezel are one integral piece.

4. The speaker grille bezel-retainer of claim 2 further comprising flat serrations on one surface of said bezel ring so as to provide a better gripping surface during manual installation of said bezel-retainer.

5. The speaker grille bezel-retainer of claim 2 further comprising a lip protruding from the inside diameter surface of said tubular portion of said bezel so as to provide a support surface for said means for closing said inside diameter of said bezel.

6. The speaker grille bezel-retainer of claim 4 wherein said means for closing said inside diameter of said bezel is perforated aluminum and said bezel is molded plastic.

* * * * *

UNITED STATES PATENT OFFICE
CERTIFICATE OF CORRECTION

PATENT NO. : 4,326,599

DATED : April 27, 1982

INVENTOR(S) : Phillip B. Thompson
Hill W. Roberts

It is certified that error appears in the above-identified patent and that said Letters Patent are hereby corrected as shown below:

Col. 2, line 34; after "block 33", change "the" to and

Col. 2, line 36; change "alternatively" to alternately

Col. 3, line 4; after "aligned", change "parts" to pairs

Signed and Sealed this

*Twenty-ninth* Day of *November 1983*

[SEAL]

*Attest:*

GERALD J. MOSSINGHOFF

*Attesting Officer* *Commissioner of Patents and Trademarks*